United States Patent
Khan et al.

(10) Patent No.: US 9,689,245 B2
(45) Date of Patent: Jun. 27, 2017

(54) QUANTIFICATION OF SKIN IN HYDRAULIC FRACTURING OF LOW AND TIGHT RESERVOIRS

(71) Applicant: King Fahd University of Petroleum and Minerals, Dhahran (SA)

(72) Inventors: Rizwan Ahmed Khan, Dhahran (SA); Sami Abdulaziz Alnuaim, Dhahran (SA); Muzammil Hussain Rammay, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 703 days.

(21) Appl. No.: 14/162,877

(22) Filed: Jan. 24, 2014

(65) Prior Publication Data
US 2015/0211339 A1    Jul. 30, 2015

(51) Int. Cl.
*E21B 43/00* (2006.01)
*G01V 99/00* (2009.01)
*E21B 43/26* (2006.01)

(52) U.S. Cl.
CPC ............ *E21B 43/26* (2013.01); *G01V 99/005* (2013.01)

(58) Field of Classification Search
CPC .............. E21B 41/0092; E21B 49/008; G01V 2210/00
See application file for complete search history.

(56) References Cited

U.S. PATENT DOCUMENTS

| | | |
|---|---|---|
| 6,101,447 A | 8/2000 | Poe, Jr. |
| 6,941,804 B2 | 9/2005 | Hasem et al. |
| 7,369,979 B1 | 5/2008 | Spivey |
| 7,657,494 B2 | 2/2010 | Wilkinson et al. |
| 2008/0082469 A1* | 4/2008 | Wilkinson ............ E21B 43/00 706/13 |

(Continued)

FOREIGN PATENT DOCUMENTS

| | | |
|---|---|---|
| CN | 102865060 A | 1/2013 |
| WO | WO 2008/036664 A2 | 3/2008 |
| WO | WO 2009/084973 A1 | 7/2009 |

OTHER PUBLICATIONS

Hawkins, M. F. (Dec. 1, 1956). A Note on the Skin Effect. Society of Petroleum Engineers. doi:10.2118/732-G.*

*Primary Examiner* — Omar Fernandez Rivas
*Assistant Examiner* — Bijan Mapar
(74) *Attorney, Agent, or Firm* — Oblon, McClelland, Maier & Neustadt, L.L.P.

(57) ABSTRACT

The feasibility of performing hydraulic fracturing can be assessed by analyzing the effect of skin on the overall deliverability of a reservoir. Aspects of the disclosure provide a method to determine equivalent skin in hydraulic fractured system through a semi analytical correlation obtained by numerical modeling. Two 3D models are considered: a base case without fracture and a complex case with fractures. The base case is simulated by varying matrix permeabilities while the fractured model is run with different sets of varying fracture's lengths, widths, and permeability as well as matrix permeabilities. The two cases are comparatively analyzed and skin is determined. A generalized correlation for determination of skin is derived through application of multivariate regression technique on obtained skins and their corresponding variables.

14 Claims, 3 Drawing Sheets

(56) References Cited

U.S. PATENT DOCUMENTS

| | | |
|---|---|---|
| 2013/0073268 A1 | 3/2013 | Abacioglu et al. |
| 2013/0124171 A1* | 5/2013 | Schuette ............. G06F 17/5009 |
| | | 703/2 |
| 2014/0083687 A1* | 3/2014 | Poe ......................... E21B 43/26 |
| | | 166/250.1 |
| 2014/0136116 A1* | 5/2014 | Banian .................. E21B 43/305 |
| | | 702/12 |

* cited by examiner

QUANTIFICATION OF SKIN IN HYDRAULIC FRACTURING OF LOW AND TIGHT RESERVOIRS

BACKGROUND

Field of Disclosure

Embodiments described herein generally relate to quantify skin prior to hydraulic fracturing of low and tight reservoirs. Specifically, embodiments discussed herein are directed towards using a correlation to quantify the skin in pre-analysis of hydraulic fracturing study which affect the overall deliverability of a reservoir and to plan hydraulic fracturing design accordingly.

Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Hydraulic fracturing is frequently practiced to stimulate unconventional and tight reservoirs. The technique increases the deliverability of a reservoir by inducing a reduction in pressure drawn downwards and exposing more reservoir contact. Further, fracturing can also help break through severe formation damage and can make low permeability and tight reservoirs economically viable.

Current economies emphasize the need for optimizing the production of gas from tight reservoirs. Such optimization is important considering that the costs of drilling new wells and operating existing wells are high by historical standards, largely because of the extreme depths to which new producing wells must be drilled and because of other physical barriers to discovering and exploiting reservoirs. These high economic stakes demand operators to devote substantial resources toward effective management of reservoirs.

Prior to executing hydraulic fracturing, the feasibility of the fracturing operation can be assessed by analyzing the effect of skin on the overall deliverability of the system. There are two ways to quantify the skin prior to execution of the hydraulic fracturing: either by using analytical models or numerically simulating the whole scheme for evaluating this effect. However, such analytical models are either based on simple assumptions which could lead to wrong estimation of skin, or the numerical simulations are too complex to solve, and their processing times are unacceptable. After, the execution of the job, the true value of skin can be calculated by conducting the well test analysis. The focus of the work conducted thus far has been on the building of pressure transient analysis or assessment of characteristics of an existing fracture and its associated conductivity, and the determination and improvement of productivity of an optimized fracture design. Outcomes of these investigations are presented in the form of plotted graphs, or correlations that outline the productivity, skin factor or effective well-bore radius.

The focus of the work conducted thus far has been on building of pressure transient analysis or assessment of characteristics of an existing fracture and its associated conductivity and the determination and improvement of productivity of an optimized fracture design. Outcomes of these investigations are presented in the form of plotted graphs, or correlations that outline the productivity, skin factor or effective well-bore radius.

For example, the work conducted by McGuire and Sikora studies the effect of finite conductivity of a vertical fracture on the productivity of wells in a pseudo steady state with the help of an electric analogue computer. The curves obtained by this study are still one of most broadly used reference diagnostics plots for productivity forecasting. The McGuire and Sikora curves validate the productivity of hydraulic fracturing as a function of fracture length (penetration) and relative conductivity.

Prats devised an analytical model for prediction of pseudo steady state behavior in a system of finite conductivity vertical fracture. In this work, Prats introduced the notion of effective well bore radius and the realization that there is an optimum length-width ratio (dimensionless conductivity) for a given fracture volume that maximizes the productivity. Prats concluded that smaller values of effective wellbore radius correspond to less effective fractures. Prats established that the pressure profile in the fracture system is a function of fracture half-length and relative capacity (a), and is defined as:

$$a = \frac{\pi * K * X_f}{2 * W * K_f}$$

$$r'_{w_D} = \frac{r'_w}{X_f}$$

In another work, Cinco-ley and Samaniego outlined a new technique for evaluating pressure transient analysis for vertical finite-conductivity fracture. The major contributions of this work were: 1) the introduction of pseudo skin function and 2) the presentation of curves for dimensionless effective wellbore radius versus fracture conductivity and damaged fracture. The concept of equivalent skin effect for pseudo radial and pseudo steady state flow varying with fracture conductivity were obtained from their analysis.

$$C_{fD} = \frac{K_f \times w}{K \times X_f}$$

Economides and Valko determined the pseudo steady state productivity index of a fractured well and obtained some charts for optimum design of fractured wells.

$$J_{D_{pss}} = \frac{1}{\operatorname{Ln}\frac{r_e}{X_f} - 0.75 + \operatorname{Ln}\frac{X_f}{r_w} + S_f}$$

Further, Meyer and Jacot introduced dimensionless productivity index and equation for effective wellbore radius. Meyer and Jacot also introduced a simple equation for estimating pseudo fracture skin when fracture length is negligible as compared to reservoir length.

$$r'_w = \frac{X_f}{\frac{\pi}{C_{fD}} + 2}$$

In the formulas above the variables represent the following:
CfD=fracture conductivity.

h=formation thickness
k=absolute reservoir permeability
kf=absolute fracture permeability
P=pressure
q=flow rate
r=radius
S=skin factor
wf=fracture width
Xf=Half length of the fracture
µ=viscosity
ρ=density
$J_{D_{gss}}$=Dimensionless Productivity Index
Subscripts represent the following
d=damage
D=dimensionless
e=external as in re
i=an index
j=an index
f=fracture
w=well-bore Skin is a valuable tool for determining the performance of hydraulic fracturing. Proper quantification of the effect of hydraulic fracturing in a simulation model is critical due to the difference of fluid flow behavior between the fracture and porous media. A conventional but costly approach to cater to this effect is to locally refine grid cells around the well bore for capturing the abrupt changes in flow parameters in this vicinity. The exercise is inevitable since normal grid size employed for rest of the system cannot model fractures with average widths of 1 cm. A cost effective and easier solution is introducing skin, which can assist reservoir engineers to predict the enhanced productivity attributed to fractures. Accordingly, there is a requirement for a cost-effective model that determines skin factor of the reservoir using correlation within relationship with other critical parameters that define a hydraulically fractured reservoir.

SUMMARY

The present disclosure investigates equivalent skin in hydraulic fractured system. The result of this study is presented in the form of easy-to-use correlation. Specifically, the present disclosure summarizes a formulation that expresses the effect of fracture on flow performance in a hydraulic fracture system as compared to that of an equivalent open-hole system.

Another embodiment provides a method that includes providing a first model of a portion of earth containing a reservoir, the first model specifying parameters defining the reservoir; computing a first productivity index of the first model for a first set of data points; providing a second model of the reservoir that includes fractures; computing a second productivity index of the second model for a second set of data points; calculating skin based on the computed first and second productivity indexes; and performing regression analysis, using a subset of the second set of data points to obtain skin correlation.

Another embodiment provides a non-transitory computer readable medium having stored thereon a program that when executed by a computer causes the computer to execute a method to simulate a reservoir, the method comprising: providing a first model of a portion of earth containing a reservoir, the first model specifying parameters defining the reservoir; computing a first productivity index of the first model for a first set of data points; providing a second model of the reservoir that includes fractures; computing a second productivity index of the second model for a second set of data points; calculating skin based on the computed first and second productivity indexes; and performing regression analysis, using a subset of the second set of data points to obtain skin correlation.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1B:
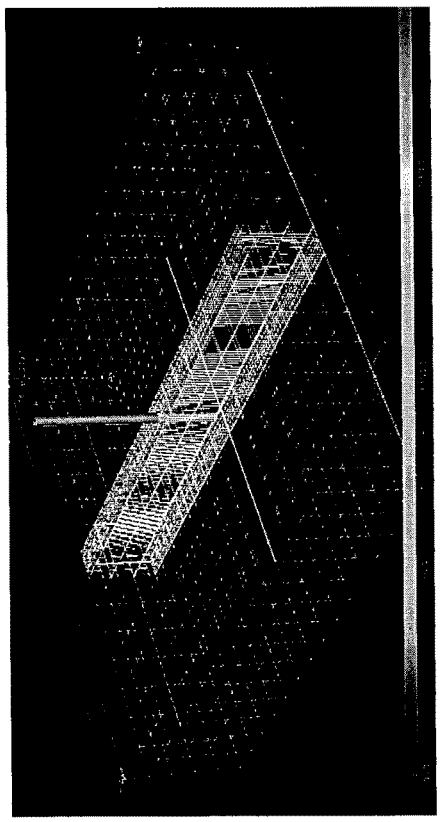
FIG. 1B shows a view of the simulation model on which local grid refinement is performed and FIG. 1C depicts a top view of the local grid refined model.
Figure 1C:
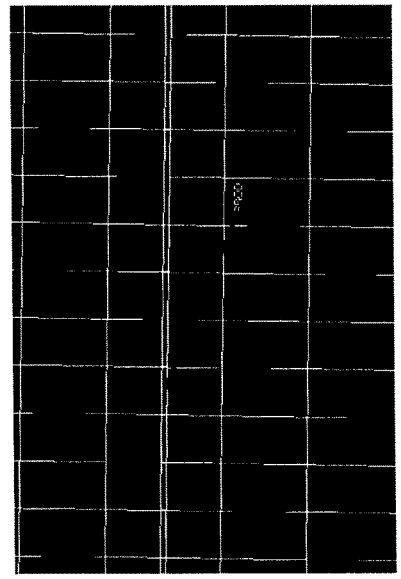

Hydraulic fracturing ("fracing" or "fracking") of the formation around a wellbore is a common technique for increasing production from tight gas formations. Hydraulic fracturing involves the pumping of fluid, typically water with some chemicals, under pressure through the wellbore and into the formation. The pressure of the fluid, along with the chemical action of any chemical additives present in the fluid, cause the surrounding formation to fracture, with the line of the fracture extending from the wellbore at each perforation. The crack created by the fracture can extend on the order of hundreds of feet from the wellbore, but is typically quite narrow. Proppants, in the form of particles of silicas or sands of a selected size and composition, are typically pumped into the fracture via the wellbore, to ensure that the fracture does not close upon release of the fluid pressure. The fractures thus extend the reach of the wellbore into the formation, by providing one or more paths of high gas conductivity for a significant distance from the wellbore into the formation.

The success or failure of a hydraulic fracture treatment often depends on the quality of the candidate well selected for the treatment. Choosing an excellent candidate for stimulation often ensures success, while choosing a poor candidate normally results in economic failure. To select the best candidate for stimulation, a design engineer must consider many variables. The most critical parameters for hydraulic fracturing are formation permeability, skin factor, reservoir pressure, reservoir depth and the like. The skin factor refers to whether the reservoir is already stimulated or is damaged. If the skin factor is positive, the reservoir is damaged, and the well could be an excellent candidate for stimulation.

In order to determine the effect of various parameters on the productivity of the reservoir, a model that mimics the performance of the reservoir can be constructed. The reservoir model can be based on seismic and other geological surveys of the production field, along with conclusions that can be drawn from well logs, pressure transient analysis, and the like. The model can then be applied to a reservoir "simulator" computer program, by way of which the reservoir engineer can analyze the behavior of the reservoir under production conditions, and by way of which the engineer can simulate the behavior of the reservoir in response to potential reservoir management actions (i.e., "what-if" analysis). Simulation of the reservoir behavior can then be attained by stepping in time and evolving the inter-element flows and the pressures at each grid element over a sequence of the time steps. Alternatively, simulation of the reservoir behavior can be also be obtained by considering a plurality of reservoir variables and simulating the computer program over a wide range of parameter values.

In what follows, a technique of formulating a model for simulation is first described, followed by a method of computing skin in hydraulic fractured wells and further determining the correlation of the computed skin with a plurality of critical parameters that affect the overall productivity of the well.

According to an embodiment of the disclosure, the parameter skin is considered to include a pseudo-fracture skin parameter and a skin factor. Specifically, the parameter equivalent skin is the skin that accounts for all factors contributing to the resistance of flow in a hydraulic fractured well. Further, flow around the wellbore of a well is usually stabilizes rapidly. Thus, in the simulator, flow from the well grid block into the wellbore is calculated at a steady state condition. Furthermore, the simulation model assumes: (1) a fracture penetrates in both directions symmetrically through the whole height of reservoir; (2) the flow of fluids in the wellbore follows the well-known Darcy's law; (3) the reservoir pressure is always above bubble point pressure; (4) a vertical well is placed in the center and (5) the fluid is a single phase type fluid.

Figure 1A:
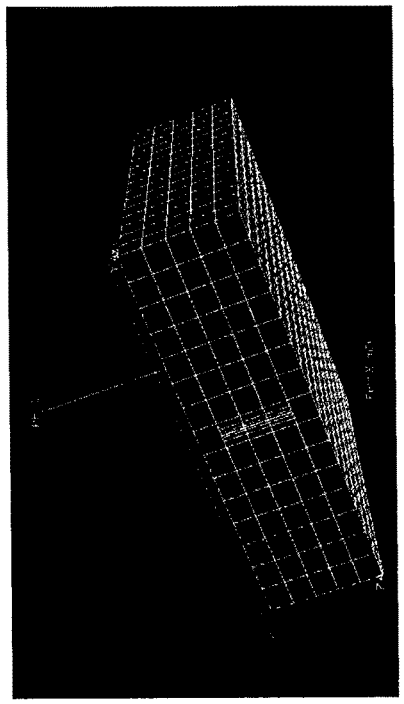
FIG. 1A depicts a side view of a simulation model.

FIG. 1A depicts a side view of the simulation model formulated according to an embodiment of the disclosure. The model is formulated on commercial software such as Eclipse or the like. The model is divided into 1125 grid blocks, 15 blocks in x-axis direction, 15 blocks in y-axis direction and 5 blocks in z-axis direction. The dimension of each grid in the x-axis and the y-axis direction is 200 ft and in z-axis direction is 5 ft, respectively.

Further, as shown in FIG. 1B, Local Grid Refinement (LGR) is applied to the 8 blocks in the y direction, wherein a single grid is further scattered into 10 small blocks in x-direction and 7 blocks in y-direction. LGR is a technique of defining fine grid cells of small size in some regions of the overall modeled volume with coarse grid cells of larger size defining other regions of the volume. Transmission corrections derived from the fine grid cells can be applied to the coarse grid cells to accurately simulate flow behavior in the reservoir. The dimension of the grid in LGR for the x-direction is 20 ft and the dimension is 28.57 ft in y-direction. The near grid blocks and near the fracture grids are finer than the remaining blocks of the grid in order to capture, more accurately, the sudden change in flow parameters in these areas (especially near the well bore) where flow velocity is maximum. In practice, the width of the fracture in a hydraulically stimulated well changes over a certain time period. However, according to an embodiment, since it is difficult to change the width of a fracture in millimeters, in the simulation model, the width is kept constant for particular simulation iteration. However, the product of permeability (kf) and the width fracture (W) is obtained by the variation in permeability that is calculated varying the width that is used in the simulation model to account for variation in width.

Since the flow of the fluids in the reservoir is assumed to follow Darcy's law, the flow rate (q) can be computed as follows:

$$q = \frac{2\pi K h}{\mu} \frac{\Delta P}{\text{Ln}\left\{\frac{r_e}{r_w}\right\} + S} \qquad (1)$$

wherein, $\mu$ is the viscosity of the fluid; K is the absolute permeability of the reservoir; h is the formation thickness; S is the skin factor of the reservoir; $\Delta\Delta P$ is the pressure differential; and $r_e$ and $r_w$ represent the external radius (from the well to an external boundary) and the well bore radius, and the function Ln{ } denotes a natural logarithm. Sample values of the parameters are shown below in Table I.

TABLE I

| Sample parameters | |
| --- | --- |
| Category | Values |
| Reservoir Pressure, psi | 4500 |
| Porosity, % | 0.21 |
| Depth, ft | 8075 |
| Bo, resbbl/stb | 1.2 |
| $\mu_o$, cp | 0.8 |

Wherein $\mu_o$ the viscosity of oil and Bo is a formation volume factor which is the ratio of the volume of oil at reservoir (in-situ) conditions to that at stock tank (surface) conditions.

The change in skin is calculated by fold of increase formula, wherein the simulator predicts the flow rate before and after skin. The ratio of productivity indexes can be calculated as follows:

$$\frac{J}{J_b} = \frac{\text{Ln}\left(\frac{r_e}{r_w}\right)}{\text{Ln}\left(\frac{r_e}{r_w}\right) + S} \qquad (2)$$

Wherein, J and $J_b$ represent the productivity for a reservoir with fractures and without fractures respectively. Equation (2) may be used to calculate the skin at each data point of the simulation. The obtained values of skin at these data points can be used to develop a correlation of skin (described later) with other parameters that affect the deliverability of the reservoir.

The external radius or pressure equivalent radius can be calculated by using Peaceman's Formula as below:

$$r_{eq} = 0.28 * \frac{\left([D_x]^2\left(\frac{K_y}{K_x}\right)^{\frac{1}{2}} + [D_y]^2\left(\frac{K_x}{K_y}\right)^{\frac{1}{2}}\right)^{1/2}}{\left(\frac{K_y}{K_x}\right)^{\frac{1}{4}} + \left(\frac{K_x}{K_y}\right)^{\frac{1}{4}}} \qquad (3)$$

wherein, $D_x$ and $D_y$ are the x-axis and y-axis dimensions of the grid block, and $K_x$ and $K_y$ and are the permeabilities along the respective axis directions. In equations (1) and (2), $r_w$ is the wellbore radius, $r_e$ is the external radius, and $r_{eq}$ is the pressure equivalent radius.

Figure 2:
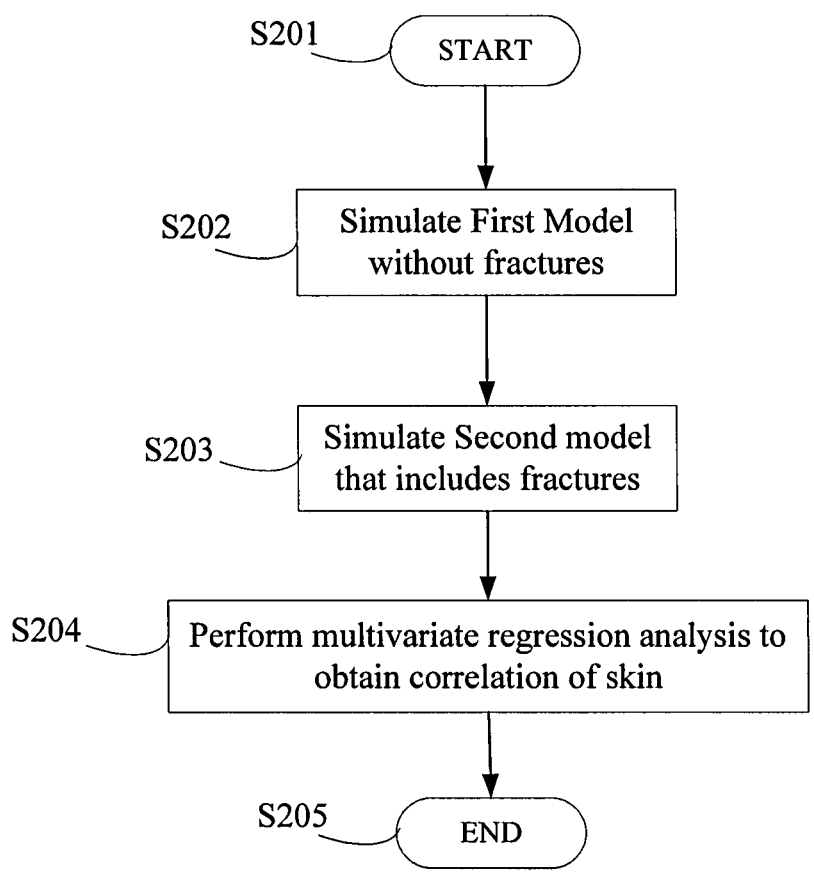
FIG. 2 is a flowchart depicting steps performed to obtain a skin correlation.

FIG. 2 is a flowchart depicting steps performed to obtain correlation of skin with respect to other variables that define the reservoir.

The process starts in S201 and proceeds to S202. In S202, the base model is constructed to define a reservoir with no fractures and no skin is considered in this model. The base model is simulated a predetermined number of times by simply changing the matrix permeability for each iteration of the simulation. For example, according to one embodiment, the base model is simulated by changing the matrix permeability as shown below in Table II:

TABLE II

Range of matrix permeability.

| Category | Values | Steps |
|---|---|---|
| Matrix Premeability, md | 0.001-1 | 16 |

Specifically, the base model is simulated a total of sixteen times, wherein the matrix permeability for each simulation iteration is changed from 0.001 to 1. Further, the eclipse model can be coupled with a mathematical software such Matlab or the like to execute the entire simulation. Matlab changes the input data file of eclipse by changing the matrix permeability at each execution and performs the simulation. Furthermore, Matlab computes the productivity index by using a straight line equation. The calculated productivity index is calculated as shown below:

$$J = \frac{qo}{P_R - P_{wf}} \quad (4)$$

Wherein, qo is the flow rate of oil, $P_R$ is the reservoir pressure and $P_{wf}$ is the well flowing pressure. The process then moves to step S203 and simulates a model which includes fractures. This model is simulated by changing fracture permeability, fracture width, half-length and matrix permeability or the like. For example, according to an embodiment, one parameter is changed at each iteration of the simulation as shown below:

| Parameter | Values | Steps |
|---|---|---|
| Matrix Permeability, md | 0.001-1 | 16 |
| Fracture Permeability, md | 10000-290000 | 15 |
| Fracture Half-length, ft | 100-1100 | 11 |
| Fracture Width, in | 0.01-0.5 | 11 |

Thus, the entire simulation data space includes 29040 data points. The simulation data space is merely a product of the number of times each variable is changed during simulation. The productivity index for the fracture inclusion case is calculated is computed using a straight line equation. Thus, the skin at each data point is computed as:

$$\frac{J}{J_b} = \frac{Ln\left(\frac{r_e}{r_w}\right)}{Ln\left(\frac{r_e}{r_w}\right) + S} \quad (5)$$

Upon computing the skin in S203, the process moves to S204 to compute a skin correlation to other parameters that define the reservoir. Specifically, regression analysis is performed to obtain the skin correlation. Regression analysis is a statistical way for evaluating the relationship amongst a plurality of variables. It includes techniques for modeling and examining several variables, wherein the aim is to develop a relationship between a dependent variable and of independent variables. According to an embodiment, multivariate regression analysis is performed to define a formula that can delineate how elements in a vector of variables respond simultaneously to changes in others. Multivariate regression analysis is performed on data set to obtain an equation. A normal equation method is used to fit a set of 20000 points (68.87%) out of total of 29040 points. The remaining unused points are used for testing purposes. The equivalent skin (S) is obtained as:

$$S = -2.7798 + 0.1183 K_m - 0.0003 X_f - 4.4211 W - 0.0477 * Ln\ (K_f) - 0.0634 * Ln\ (C_{fD}) \quad (6)$$

Wherein, $K_m$ is Matrix Permeability (md); $K_f$=Fracture Permeability (md); $X_f$=Fracture Half Length (ft); W=Fracture Width (ft) and $C_{fD}$=Dimensionless quantity. Upon computing the skin correlation the process ends.

According to an embodiment, the derived correlation is validated by comparing the results of the obtained correlation with existing analytical approaches for estimating skin. The results are evaluated in terms of absolute percentage error, average percentage error, and standard deviation. Specifically, the newly derived correlation is validated by comparing the results with prevailing analytical approaches for skin estimation using absolute percentage error, average percentage error and standard deviation. It is determined that the degree of absolute percentage error, average percentage error and standard deviation, by using the new correlation reduces to 3.21%, 3%, and 6.4536 respectively.

The error for computing the correlation using only a subset of the data points (20000 points) is shown in Table III as follows:

TABLE III

Error computation using subset of data points

| Mean Square Error | Average Absolute Error | Average Error | Standard Deviation |
|---|---|---|---|
| 1.18% | 2.83% | 0.254% | 5.7679 |

The correlation is further tested on the unused (9040 out of 29040) points. The predicted error is depicted in Table IV as follows:

TABLE IV

| Mean Square Error | Average Absolute Error | Average Error | Standard Deviation |
|---|---|---|---|
| 1.81% | 3.21% | 3% | 6.4536 |

Error is defined mathematically as follows:

$$Ei = \frac{(Hl(\text{estimated}) - Hl(\text{measured}))}{Hl(\text{measured})} * 100 \quad (7)$$

The absolute average percentage error (AAPE) is defined mathematically as follows:

$$AAPE = \frac{1}{n}\sum_{i=1}^{n} |Ei| \qquad (8)$$

The average percentage error (APE) is defined as follows:

$$APE = \frac{1}{n}\sum_{i=1}^{n} Ei \qquad (9)$$

The standard deviation (SD) is defined mathematically as follows:

$$SD = \left[\frac{n\sum_{i=1}^{n}(Ei)^2 - \left(\sum_{i=1}^{n} Ei\right)^2}{n^2}\right]^{0.5} \qquad (10)$$

The computed skin correlation is also compared with the Meyer and Jacot analytical equation. The comparison with the Meyer and Jacot correlation is performed on the two data sets. For a data set that includes 20000 points, the results obtained are shown in Table IV:

TABLE IV

| Average Absolute Error | Average Error | Standard Deviation |
|---|---|---|
| 43.73% | 43.7% | 15.61 |

For a data set that includes 9040 points the error analysis is depicted in Table V as shown below:

TABLE V

| Average Absolute Error | Average Error | Standard Deviation |
|---|---|---|
| 42.06% | 41.9% | 14.86 |

The computed correlation accounts for 3D flow and anisotropy that can predict the skin during the study of pre-fracture analysis. The comparison between percentage errors of analytical approach and developed correlation shows that the computed correlation proves to be an efficient tool for more accurate and realistic determination of skin values. While numerical simulation of a whole fracturing job is not commercially viable in field cases with competitive profit margins, the skin correlation can prove to be an effective alternative for analyses of the effect of skin on the overall deliverability of reservoir prior to execution of fracturing. It gives reliably accurate estimations on the basis of simulation results, and has a considerably lower percentage error as compared to other analytical correlations.

Figure 3:
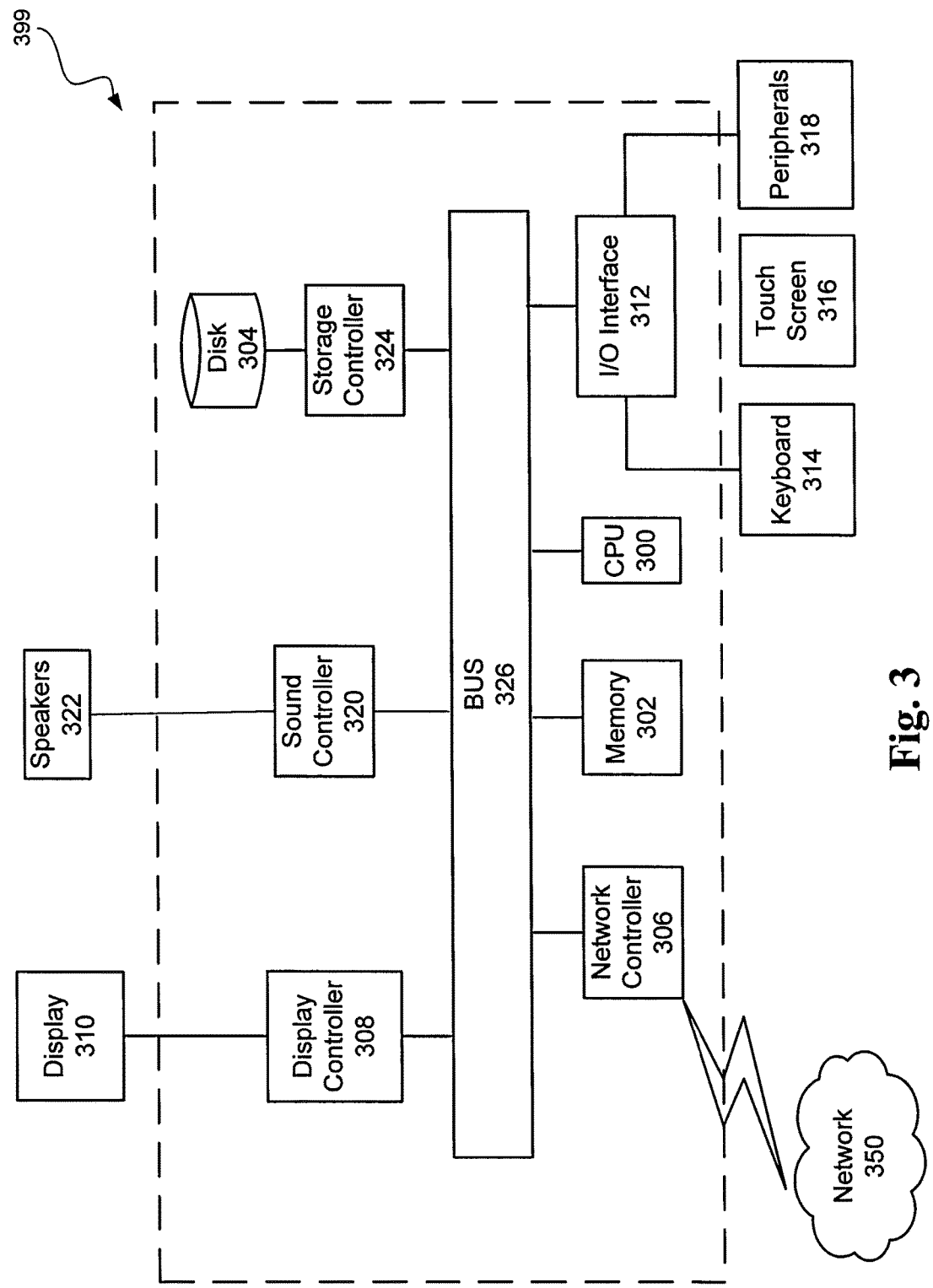
FIG. 3 illustrates a block diagram of a computing device according to an embodiment.

In FIG. 3, the computer 399 includes a CPU 300 which performs the processes described above. The process data and instructions may be stored in memory 302. These processes and instructions may also be stored on a storage medium disk 304 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the system communicates, such as a server or computer.

Further, the claimed advancements may be provided as a utility application, background daemon, or component of an operating system, or combination thereof, executing in conjunction with CPU 300 and an operating system such as Microsoft Windows 7, UNIX, Solaris, LINUX, Apple MAC-OS and other systems known to those skilled in the art.

CPU 300 may be a Xenon or Core processor from Intel of America or an Opteron processor from AMD of America, or may be other processor types that would be recognized by one of ordinary skill in the art. Alternatively, the CPU 300 may be implemented on an FPGA, ASIC, PLD or using discrete logic circuits, as one of ordinary skill in the art would recognize. Further, CPU 300 may be implemented as multiple processors cooperatively working in parallel to perform the instructions of the inventive processes described above.

The computer 399 in FIG. 3 also includes a network controller 306, such as an Intel Ethernet PRO network interface card from Intel Corporation of America, for interfacing with network 350. As can be appreciated, the network 350 can be a public network, such as the Internet, or a private network such as an LAN or WAN network, or any combination thereof and can also include PSTN or ISDN subnetworks. The network 350 can also be wired, such as an Ethernet network, or can be wireless such as a cellular network including EDGE, 3G and 4G wireless cellular systems. The wireless network can also be WiFi, Bluetooth, or any other wireless form of communication that is known.

The computer 399 further includes a display controller 308, such as a NVIDIA GeForce GTX or Quadro graphics adaptor from NVIDIA Corporation of America for interfacing with display 310, such as a Hewlett Packard HPL2445w LCD monitor. A general purpose I/O interface 312 interfaces with a keyboard and/or mouse 314 as well as a touch screen panel 316 on or separate from display 310. General purpose I/O interface also connects to a variety of peripherals 318 including printers and scanners, such as an OfficeJet or DeskJet from Hewlett Packard.

A sound controller 320 may also be provided in the computer 399, such as Sound Blaster X-Fi Titanium from Creative, to interface with speakers/microphone 322 thereby providing sounds and/or music. The speakers/microphone 322 can also be used to accept dictated words as commands for controlling the robot-guided medical procedure system or for providing location and/or property information with respect to the target property.

The general purpose storage controller 324 connects the storage medium disk 304 with communication bus 326, which may be an ISA, EISA, VESA, PCI, or similar, for interconnecting all of the components of the robot-guided medical procedure system. A description of the general features and functionality of the display 310, keyboard and/or mouse 314, as well as the display controller 308, storage controller 324, network controller 306, sound controller 320, and general purpose I/O interface 312 is omitted herein for brevity as these features are known.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

The invention claimed is:

1. A method of operating a computer system to perform a reservoir simulation, the method comprising:
   generating a first model of a portion of earth containing the reservoir, the first model including a predetermined number of grid-blocks, and being specified by a first set of parameters including at least a permeability of each grid block;
   computing, for a first predetermined number of iterations, a first productivity index of the first model, the first productivity index at each iteration being computed based on a flow rate of a fluid obtained by changing the permeability of each grid-block by a predetermined amount;
   generating a second model of the reservoir that includes fractures;
   computing a second productivity index of the second model by simulating the second model for a second predetermined number of iterations, each iteration including, changing a value of exactly one parameter of a second set of parameters by a predetermined amount;
   calculating a skin factor based on the computed first productivity index, and the computed second productivity index; and
   computing, by regression analysis, a correlation of the computed skin factor (S), with the second set of parameters, wherein the second set of parameters includes a matrix permeability ($K_m$), a fracture permeability ($K_f$), a fracture half length ($X_f$), and a fracture width (W), and wherein the correlation is computed as:

$$S = -2.7798 + 0.1183 K_m - 0.0003 X_f - 4.4211 W - 0.0477 * L_n(K_f) - 0.0634 * L_n(C_{fd}),$$

where $C_{fd}$ is a dimensionless quantity;
   selecting a candidate well for stimulation; and
   stimulating the selected candidate well based on the computed correlation.

2. The method of claim 1, wherein the first predetermined number of iterations are sixteen, and the permeability of each grid-block is varied in the range (0.001-1).

3. The method of claim 1, wherein the first productivity index (J) is computed as $$= \frac{qo}{P_R - P_{wf}},$$

where qo is a flow rate, $P_R$ is a reservoir pressure and $P_{wf}$ is a well flowing pressure.

4. The method of claim 1, wherein the second predetermined number of iterations are 29040 iterations.

5. The method of claim 1, wherein the skin factor is calculated as:

$$\frac{J}{J_b} = \frac{Ln\left(\frac{r_e}{r_w}\right)}{Ln\left(\frac{r_e}{r_w}\right) + S}, \text{ where } \frac{J}{J_b}$$

is a ratio of the productivity indexes of the first model of the reservoir, and the second model of the reservoir, respectively, $r_w$ is a wellbore radius, $r_e$ is an external radius, and Ln represents a natural logarithm.

6. The method of claim 1, wherein the computed skin correlation has an average absolute error of 3.21%.

7. A non-transitory computer readable medium having stored thereon a program that when executed by a computer causes the computer to execute a method to simulate a reservoir, the method comprising:
   generating a first model of a portion of earth containing the reservoir, the first model including a predetermined number of grid-blocks, and being specified by a first set of parameters including at least a permeability of each grid block;
   computing, for a first predetermined number of iterations, a first productivity index of the first model, the first productivity index at each iteration being computed based on a flow rate of a fluid obtained by changing the permeability of each grid-block by a predetermined amount;
   generating a second model of the reservoir that includes fractures;
   computing a second productivity index of the second model by simulating the second model for a second predetermined number of iterations, each iteration including, changing a value of exactly one parameter of a second set of parameters by a predetermined amount;
   calculating a skin factor based on the computed first productivity index, and the computed second productivity index; and
   computing, by regression analysis, a correlation of the computed skin factor (S), with the second set of parameters, wherein the second set of parameters includes a matrix permeability ($K_m$), a fracture permeability ($K_f$), a fracture half length ($X_f$), and a fracture width (W), and wherein the correlation is computed as:

$$S = -2.7798 + 0.1183 K_m - 0.0003 X_f - 4.4211 W - 0.0477 * L_n(K_f) - 0.0634 * L_n(C_{fd}),$$

where $C_{fd}$ is a dimensionless quantity;
   selecting a candidate well for stimulation; and
   stimulating the selected candidate well based on the computed correlation.

8. The non-transitory medium of claim 7, wherein the first predetermined number of iterations are sixteen, and the permeability of each grid-block is varied in the range (0.001-1).

9. The non-transitory medium of claim 7, wherein the second predetermined number of iterations are 29040 iterations.

10. The non-transitory medium of claim 7, wherein the first productivity index (J) is computed as $$J = \frac{qo}{P_R - P_{wf}},$$

where qo is a flow rate, $P_R$ is a reservoir pressure and $P_{wf}$ is a well flowing pressure.

11. The non-transitory medium of claim 7, wherein the skin factor is calculated as:

$$\frac{J}{J_b} = \frac{Ln\left(\frac{r_e}{r_w}\right)}{Ln\left(\frac{r_e}{r_w}\right) + S}, \text{ where } \frac{J}{J_b}$$

is a ratio of the productivity indexes of the first model of the reservoir, and the second model of the reservoir, respectively, $r_w$ is a wellbore radius, $r_e$ is an external radius, and Ln represents a natural logarithm.

12. The non-transitory medium of claim 7, wherein the computed skin correlation has an average absolute error of 3.21%.

13. The method of claim 1, further comprising:
hydraulically fracturing the well, wherein the first productivity index (J) of the well before fracturing is computed as:

$$J = \frac{qo}{P_R - P_{wf}},$$

where qo is a flow rate, $P_R$ is a reservoir pressure, and $P_{wf}$ is a well flowing pressure, and the second productivity index, $J_b$, after fracturing is computed as $$\frac{J}{J_b} = \frac{\text{Ln}\left(\frac{r_e}{r_w}\right)}{\text{Ln}\left(\frac{r_e}{r_w}\right) + S},$$

where $r_w$ is a wellbore radius, $r_e$ is an external radius, and Ln represents a natural logarithm.

14. The non-transitory medium of claim 7, further comprising:
hydraulically fracturing the well, wherein the first productivity index (J) of the well before fracturing is computed as:

$$J = \frac{qo}{P_R - P_{wf}},$$

where qo is a flow rate, $P_R$ is a reservoir pressure, and $P_{wf}$ is a well flowing pressure, and the second productivity index, $J_b$, after fracturing is computed as $$\frac{J}{J_b} = \frac{\text{Ln}\left(\frac{r_e}{r_w}\right)}{\text{Ln}\left(\frac{r_e}{r_w}\right) + S},$$

where $r_w$ is a wellbore radius, $r_e$ is an external radius, and Ln represents a natural logarithm.

* * * * *